(12) United States Patent
Kajihara et al.

(10) Patent No.: US 9,322,095 B2
(45) Date of Patent: Apr. 26, 2016

(54) FILM-FORMING APPARATUS

(71) Applicant: CANON ANELVA CORPORATION, Kawasaki-shi (JP)

(72) Inventors: Yuji Kajihara, Fuchu (JP); Yasushi Yasumatsu, Inagi (JP); Kazuya Konaga, Kawasaki (JP)

(73) Assignee: CANON ANELVA CORPORATION, Kawasaki-shi (JP)

( * ) Notice: Subject to any disclaimer, the term of this patent is extended or adjusted under 35 U.S.C. 154(b) by 289 days.

(21) Appl. No.: 14/053,940

(22) Filed: Oct. 15, 2013

(65) Prior Publication Data

US 2014/0034489 A1    Feb. 6, 2014

Related U.S. Application Data

(63) Continuation of application No. PCT/JP2012/002611, filed on Apr. 16, 2012.

(30) Foreign Application Priority Data

Apr. 28, 2011   (JP) .................. 2011-100784

(51) Int. Cl.
*C23C 14/34* (2006.01)
*C23C 14/56* (2006.01)
(Continued)

(52) U.S. Cl.
CPC ............ *C23C 14/564* (2013.01); *C23C 14/3464* (2013.01); *H01J 37/32899* (2013.01);
(Continued)

(58) Field of Classification Search
CPC ............... C23C 14/564; C23C 14/3464; H01J 37/32899; H01J 37/3417; H01J 37/3429; H01J 37/3435; H01J 37/3447

USPC ..................................... 204/298.11
See application file for complete search history.

(56) References Cited

U.S. PATENT DOCUMENTS 4,410,407 A * 10/1983 Macaulay ............ C23C 14/564
                                                204/192.25
7,850,827 B2    12/2010 Nomura et al.
(Continued)

FOREIGN PATENT DOCUMENTS

CN    101469406 A    7/2009
CN    101824598 A    9/2010
(Continued)

OTHER PUBLICATIONS

Chinese office action issued in corresponding application No. 201280020605.6 dated Nov. 4, 2014—21 pages, with English translation.

(Continued)

*Primary Examiner* — John Brayton
(74) *Attorney, Agent, or Firm* — Fitzpatrick, Cella, Harper & Scinto

(57) ABSTRACT

A film-forming apparatus includes a plurality of target electrodes, a substrate holder for holding a substrate, a first shutter member rotatably provided between the plurality of target electrodes and the substrate holder and having a plurality of openings, first separating walls provided on a surface of the first shutter member, the surface being on the target electrode side; and second separating walls provided between the first shutter member and the target electrodes, wherein the first separating walls are provided so as to sandwich each of the plurality of openings of the first shutter member.

9 Claims, 7 Drawing Sheets

(51) Int. Cl.
*H01J 37/32* (2006.01)
*H01J 37/34* (2006.01)

(52) U.S. Cl.
CPC ......... *H01J37/3417* (2013.01); *H01J 37/3429* (2013.01); *H01J 37/3435* (2013.01); *H01J 37/3447* (2013.01)

(56) References Cited

U.S. PATENT DOCUMENTS

| | | |
|---|---|---|
| 8,900,426 B2 | 12/2014 | Nomura et al. |
| 2002/0144903 A1 | 10/2002 | Kim et al. |
| 2005/0199490 A1* | 9/2005 | Nomura ............... C23C 14/3464 204/298.11 |
| 2009/0139865 A1 | 6/2009 | Nomura et al. |
| 2009/0166195 A1* | 7/2009 | Kobayashi .......... C23C 14/3407 204/298.11 |
| 2010/0206715 A1 | 8/2010 | Hiromi et al. |
| 2010/0243438 A1 | 9/2010 | Yamaguchi et al. |
| 2014/0054167 A1* | 2/2014 | Kajihara ................. C23C 14/04 204/298.11 |

FOREIGN PATENT DOCUMENTS

| | | |
|---|---|---|
| JP | 3-204916 A | 9/1991 |
| JP | 2005-256112 A | 9/2005 |
| JP | 2008-19460 A | 1/2008 |
| JP | 2009-41108 A | 2/2009 |
| JP | 2009-147351 A | 7/2009 |
| JP | 2010-209463 A | 9/2010 |
| JP | 2011-1597 A | 1/2011 |
| KR | 10-2010-0093495 A | 8/2010 |

OTHER PUBLICATIONS

U.S. Appl. No. 14/107,110, Yuji Kajihara, filed Dec. 16, 2013.

* cited by examiner

FIG. 7

| FILM FORMATION | UPPER SHIELD (63) | FIRST SHUTTER PLATE (65) | SECOND SHUTTER PLATE (67) | OVERVIEW |
|---|---|---|---|---|
| T1 | FIXED | 0° | 0° | T1 |
| T2 | FIXED | 80° | 90° | T2 |
| T3 | FIXED | 0° | 180° | T3 |
| T4 | FIXED | 80° | 270° | T4 |
| T1-T3 Co-SP | FIXED | 0° | 90° | T1, T3 |
| T2-T4 SP-Co | FIXED | 80° | 0° | T2, T4 | ns
FILM-FORMING APPARATUS

This application is a continuation of International Patent Application No. PCT/JP2012/002611 filed on Apr. 16, 2012, and claims priority to Japanese Patent Application No. 2011-100784 filed on Apr. 28, 2011, the entire content of both of which is incorporated herein by reference.

BACKGROUND OF THE INVENTION

1. Field of the Invention

The present invention relates to a film-forming apparatus, and specifically to a technique for preventing contamination in a multi-target sputter film-forming apparatus that includes a plurality of target electrodes made of different materials in a single chamber, for example, and that forms a multi-layered film by sputtering, using a rotary shutter apparatus.

2. Description of the Related Art

A multi-target sputter film-forming apparatus (for example, Japanese Patent Laid-Open No. 2011-001597) can form a required multi-layered film in a single film-forming chamber by sputtering continuously without interruption from the bottom layer to the top layer on a substrate.

In order to form a multi-layered film by sputtering, in the film-forming apparatus disclosed in Japanese Patent Laid-Open No. 2011-001597, in a single chamber, a plurality of targets made of different materials are disposed on a ceiling portion of the substrate on which a film is to be formed, and a shutter apparatus for selecting a target to be used in sputter film formation is also provided. The shutter apparatus has a double shutter structure including shutter plates that rotate independently of each other. Each of the two shutter plates has a required number of openings formed in predetermined positions so that a selected target can be viewed from the substrate side.

With the rotary shutter apparatus, targets made of materials not to be used in film formation are shielded, and targets made of materials to be used in sputter film formation become visible from a substrate through the openings. The rotary shutter apparatus includes two shutter plates having a substantially circular shape as viewed from the substrate, and the two shutter plates are configured to rotate independently of each other. To select a target to be used in sputter film formation, each shutter plate is rotated by the rotary shutter apparatus such that a target made of a material that needs to be used in film formation faces the substrate through the opening.

In the case of sputter film formation in which a plurality of targets made of different material to be used in film formation are selected in a specific order, if contamination occurs between the targets, the performance of the formed film may be low. There is a need for a technique for reliably preventing the occurrence of contamination in order to deposit a high-performance multi-layered film on a substrate.

SUMMARY OF THE INVENTION

In view of the above-described problem, the present invention provides a film-forming apparatus that includes a plurality of targets in a single chamber so as to form a multi-layered film by sputtering and in which a target is selected with a rotary shutter apparatus, the film-forming apparatus being configured such that the occurrence of contamination is prevented between the targets.

A film-forming apparatus according to the present invention is a film-forming apparatus including: a plurality of target electrodes each having an attachment surface to which a target can be attached; a substrate holder for holding a substrate at a position opposing the plurality of target electrodes; a first shutter member rotatably provided between the plurality of target electrodes and the substrate holder and having a plurality of openings that oppose the attachment surfaces when the first shutter member is rotated; first separating walls provided on a surface of the first shatter member, the surface being on the target electrode side; and second separating walls provided between the first shutter member and the target electrodes, wherein the first separating walls are provided so as to sandwich each of the plurality of openings of the first shutter member, the second separating walls are provided so as to come into contact with the first separating wall if the first shutter member is rotated by a predetermined angle or more about a rotation shaft, and the first separating walls are positioned so as to form gaps with the second separating walls during film formation processing.

Alternatively, a film-forming apparatus according to the present invention is a film-forming apparatus including: a plurality of target electrodes each having an attachment surface to which a target can be attached; a substrate holder for holding a substrate at a position opposing the plurality of target electrodes; a first shutter member rotatably provided between the plurality of target electrodes and the substrate holder and having a plurality of openings that oppose the attachment surfaces when the first shutter member is rotated; a shield member that is provided between the first shutter member and the plurality of target electrodes and that has openings opposing the attachment surfaces, the number of the openings being equal to the number of the plurality of target electrodes; first separating walls provided on a surface of the first shutter member, the surface being on the substrate holder side; and second separating walls provided on a surface of the shield member, the surface being on the first shutter member side, wherein the first separating wall is provided so as to sandwich each of the plurality of openings of the first shutter member, the second separating wall is provided so as to come into contact with the first separating wall if the first shutter member is rotated by a predetermined angle or more about a rotation shaft, and the first separating walls are positioned so as to have gaps with the second separating walls during film formation processing.

The present invention can provide a film-forming apparatus that includes a plurality of targets in a single chamber so as to form a multi-layered film by spattering and in which a target is selected with a rotary shutter apparatus, the film-forming apparatus being configured such that contamination is prevented between the targets.

Other features and advantages of the present invention will become apparent from the following description with reference to the accompanying drawings. Note that in the accompanying drawings, the same reference numerals are given so the same or similar components.

BRIEF DESCRIPTION OF THE DRAWINGS

The accompanying drawings are included in the specification, constitute a part of the specification, show embodiments of the present invention, and are used to illustrate the principle of the present invention together wish the description in the specification.

FIG. 7 depicts a diagram illustrating operations of the shutter apparatus according to the first embodiment of the present invention.

DESCRIPTION OF THE EMBODIMENTS

Hereinafter, preferred embodiments of the present invention will be described with reference to the accompanying drawings. The members, arrangement and the like described below are merely examples embodying the invention and are not intended to limit the scope of the present invention, and thus various modifications can be made in accordance with the spirit of the present invention. The application of the film-forming apparatus according to the present invention is not limited to a spattering apparatus, and the present invention is applicable to various PVD apparatuses in which a vapor deposition material can be selected with a shutter apparatus an a vacuum container.

First Embodiment

Figure 1:
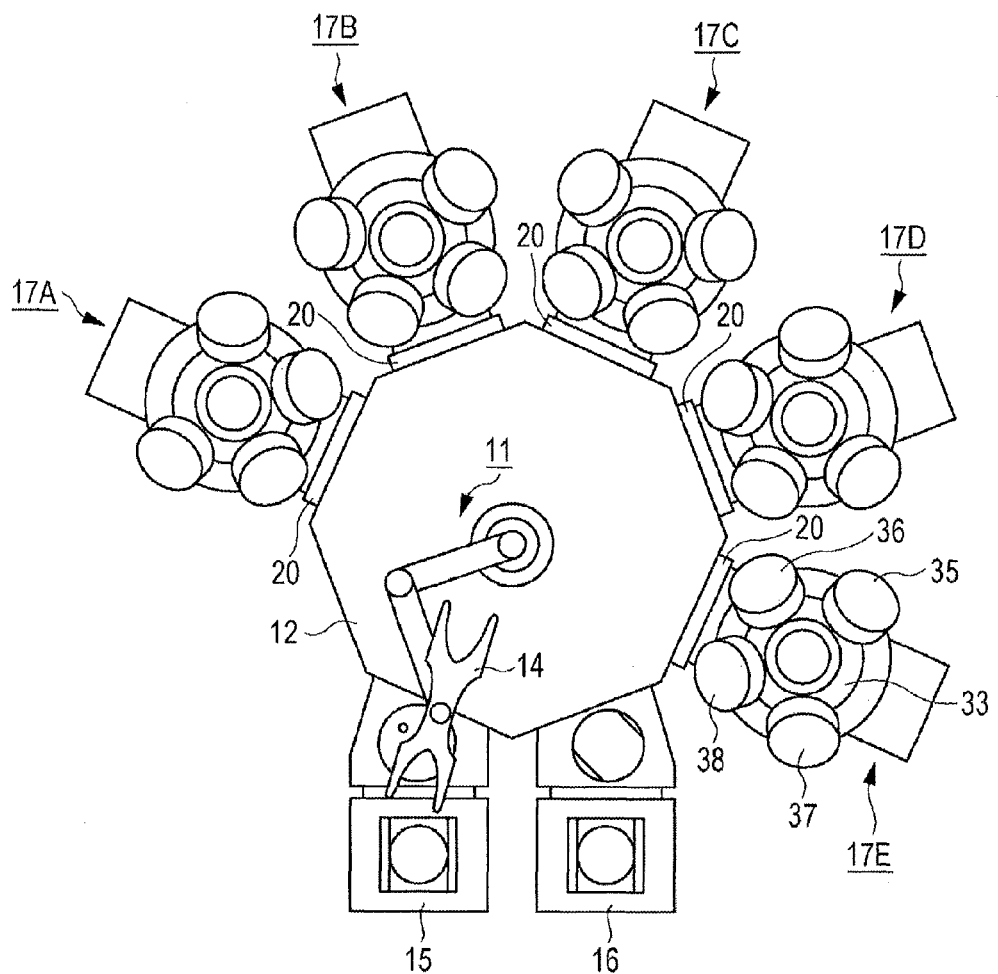
FIG. 1 depicts a plan view showing a configuration of an exemplary embodiment of a film-forming apparatus for use in a method for manufacturing a magnetoresistive device according to the present invention.

FIG. 1 is a plan view showing a representative configuration of a film-forming apparatus according to a first embodiment of the present invention, which is enlarged to such an extent that a schematic configuration of an internal mechanism can be seen. A film-forming apparatus 10 is a cluster-type film-forming apparatus, and includes a plurality of film-forming chambers. A conveyance chamber 12 equipped with a robotic conveyance apparatus 11 is installed in a central position. The robotic conveyance apparatus 11 can hold a substrate by using a hand 14 provided on a stretchable arm. The base end portion of the arm is rotatably attached to the central portion of the conveyance chamber 12.

The conveyance chamber 12 of the film-forming apparatus 10 is provides with load/unload chambers 15 and 16. The load/unload chamber 15 can load a substrate, which is a material to be processed, into the film-forming apparatus 10 from the outside and also can unload the substrate that has undergone multi-layered film formation processing from the film-forming apparatus 10 to the outside. The load/unload chamber 16 has the same function. A substrate loaded via the load/unload chamber 16 is unloaded via the load/unload chamber 16. The reason that two load/unload chambers are provided is to increase productivity by alternately using the two chambers.

In the film-forming apparatus 10, a plurality of film-forming chambers, in this case five chambers 17A, 17B, 17C, 17D and 17E (hereinafter 17A to 17E), are provided around the conveyance chamber 12. Between the two chambers is provided a gate valve 20 for isolating the two chambers and capable of opening and closing as required.

The film-forming chambers 17A to 17E are film-forming chambers for continuously forming different types of films in the same chamber. The present embodiment is configured such that multi-layered films to be deposited on a substrate are divided into a plurality of groups, and a plurality of films belonging to each group are formed in a predetermined one of the film-forming chambers. In this way, the cluster type film-forming apparatus is implemented. In the film-forming chambers 17A co 17E, magnetic films are deposited by PVD (Physical Vapor Deposition) method using spluttering. A configuration is of course possible in which a plurality of film-forming chambers that form films belonging to the same group are disposed to improve throughput.

In the film-forming apparatus 10, a substrate W loaded into the conveyance chamber 12 through the load/unload chamber 15 is introduced, by the robotic conveyance apparatus 11, into each of the film-forming chambers 17A to 17E in a predetermined order according to the multi-layered film device to be produced, and predetermined film formation processing is performed in each film-forming chamber. Examples of the multi-layered film device to be produced include LEDs, MRAMs, TMR heads, advanced (improved) GMRs and the like.

Note that, in FIG. 1, an evacuation unit for evacuating the inside of the film-forming chambers 17A to 17E into a required vacuum state, a unit for supplying power to target electrodes 35 to 38, targets respectively attached to the target electrodes 35 so 38, and a unit for generating plasma such as a process gas introducing unit are not illustrated.

Instead of the film-forming chambers, oxide film-forming chambers or cleaning chambers may be disposed if necessary. The oxide film-forming chambers are chambers in which a surface-chemical reaction that oxidizes a metal layer takes place. The surface-chemical reaction can be plasma oxidation, natural oxidation, ozone oxidation, ultraviolet ozone oxidation, radical oxidation or the like. The cleaning chambers are chambers in which surface planarization takes place with the use of an ion beam etching mechanism or an RF sputter etching mechanism. The film-forming chambers 17A to 17E of the present embodiment all have the same configuration, but of course, the type of targets mounted on the target electrodes of each film-forming chamber may be changed according to the film configuration of the multi-layered film device to be produced.

Figure 2:
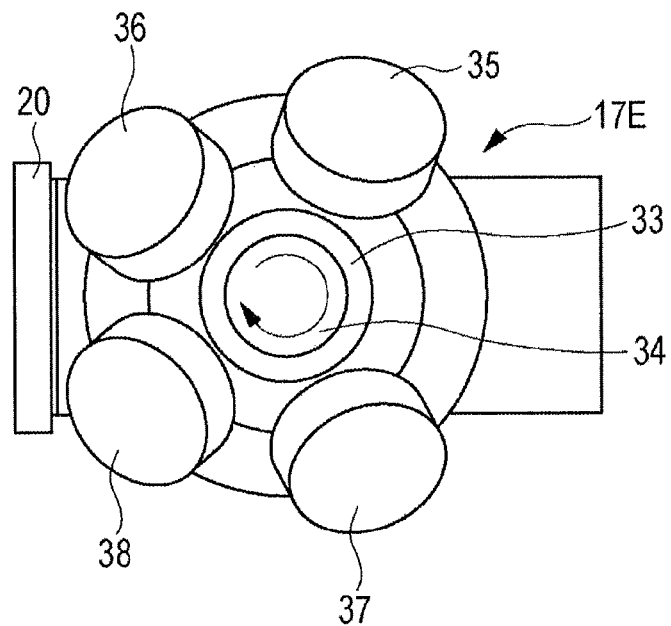
FIG. 2 depicts a top view schematically showing a configuration of a single film-forming chamber of a film-forming apparatus according to a first embodiment of the present invention.
Figure 3:
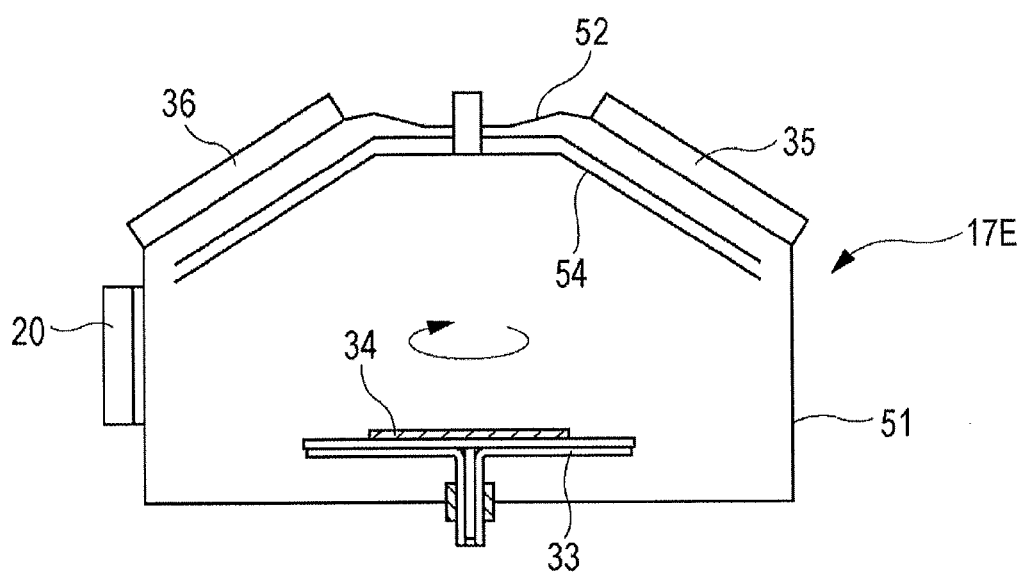
FIG. 3 depicts a vertical cross-sectional view schematically showing a configuration of the film-forming chamber shown in FIG. 2.

Next, a characteristic structure of the film-forming chambers 17A to 17E will be described with reference to FIGS. 2 and 3. Since the film-forming chambers 17A, 17B, 17C, 17D and 17E of the present embodiment all have the same configuration, the film-forming chamber 17E is shown in FIGS. 2 and 3 as a representative example. FIG. 2 is a top view of the film-forming chamber 17E as viewed from above, excluding a ceiling portion 52 in order to show the positional relationship between the target electrodes 35 to 38 and a substrate 34. FIG. 3 is a vertical cross-sectional view of the film-forming chamber 17E. In FIGS. 2 and 3, the same reference numerals are given to components that are substantially the same as those described in connection to FIG. 1.

As described above, the ceiling portion 52 of a container 51 (vacuum container) of the film forming chamber 17E is provided with four target electrodes 35 to 38. The target electrodes 35 to 38 are attached to the ceiling portion 52 at an inclination. The target electrodes are known cathodes that can each hold a target such that the target opposes the substrate, the target having a film-forming material bonded thereto. A substrate holder 33 rotatably provided at a center of a bottom portion of the film-forming chamber 17E holds the substrate 34 in a horizontal state. The substrate 34 is rotating while sputter film formation is performed on the substrate 34. A target T can be disposed on each of the inclined target electrodes 35 to 38 such that the target T opposes the upper surface of the substrate 34 horizontally located below the target electrodes. A film-forming material to be used in film formation processing is bonded to the target T. As used herein, the state in which the target T opposes the substrate encompasses a state in which the target electrode is oriented toward the periphery of the substrate, and a state as shown in FIG. 3 in which a sputter surface of the target T is inclined toward the substrate 34.

Between the targets T and the substrate 34 is disposed a shutter apparatus 54. The shutter apparatus 54 has two shutter plates. In response to an operation of the shutter apparatus 54, one of the targets T respectively attached to the four target electrodes 35 to 38 is selected as the target T used in sputter film formation.

Figure 4:
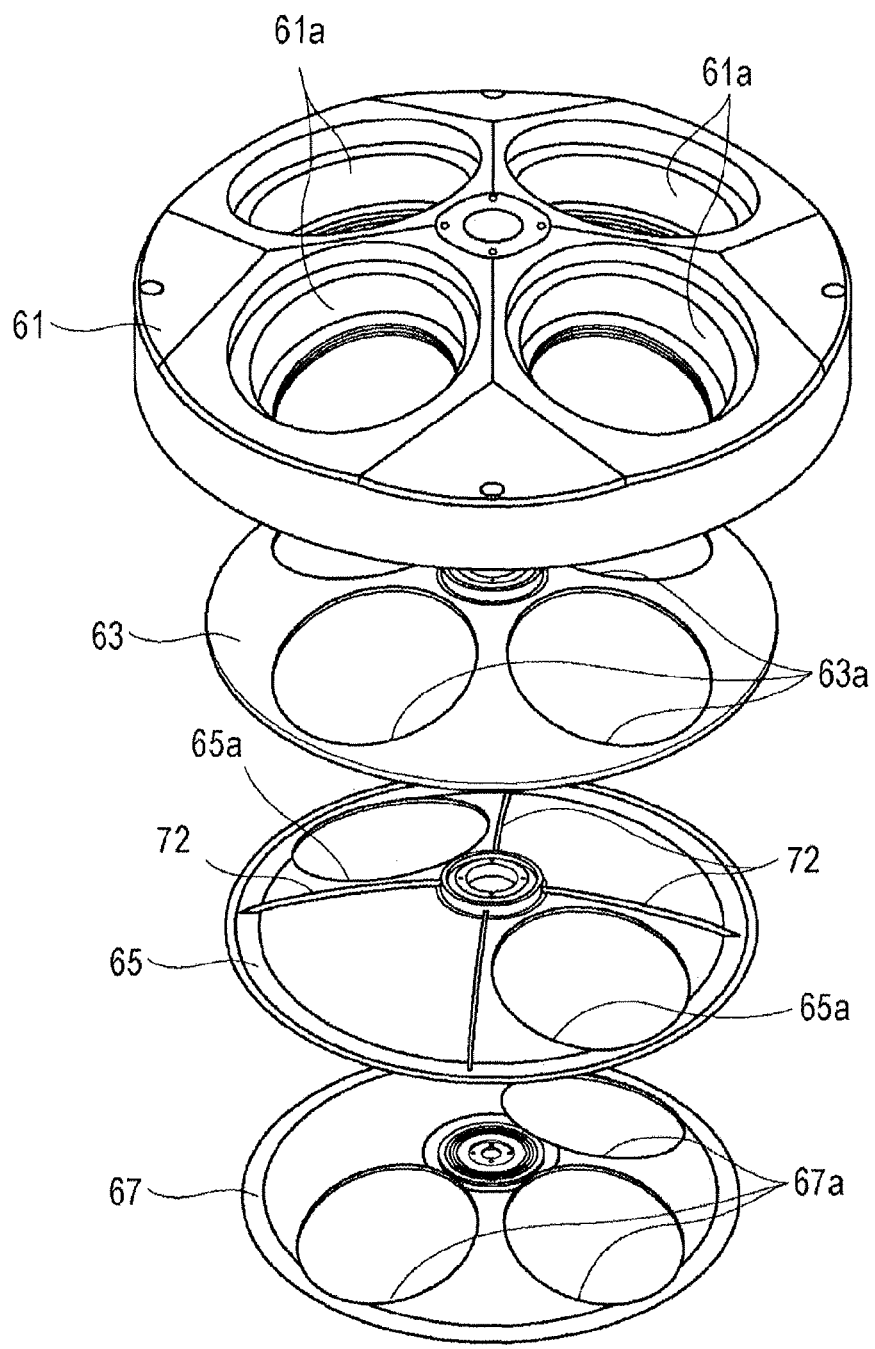
FIG. 4 depicts a perspective view showing members constituting a shutter apparatus according to the first embodiment of the present invention.

A structure of the shutter apparatus 54 will now be described with reference to FIGS. 4 to 6. FIG. 4 is a perspective view showing components constituting the shutter apparatus 54. The shutter apparatus 54 includes, as primary constituent components, for example, a target electrode holder 61, an upper shield plate (shield member) 63, a first shutter plate (first shutter member) 65 and a second shutter plate (second shutter member) 67. The first shutter plate 65 and the second shutter plate 67 are configured as shutter plates of the double rotary shutter. All of the supper shield plate 63, the first shutter plate 65 and the second shutter plate 67 may have upwardly bulged and curved shapes so that they are substantially parallel to each other.

The target electrode holder 61 is a member having four attachment portions 61a for holding the target electrodes, and is provided in an upper portion of the container 51. The target electrode holder 61 of the present embodiment also functions as a lid of the container 51, and is unitary with the ceiling portion 52. However, the attachment portions 61a may be provided on a portion of the container 51. The target electrodes held by the attachment portions 61a can each hold a target T to which a given film-forming substance for film formation processing is bonded such that the target T faces toward the direction of the substrate 34. The portion of each target electrode where a target T is held is referred to as the target attachment surface.

The upper shield plate (shield member) 63 is an adhesion preventing shield plate that is provided on the substrate holder 33 side of the target electrode holder 61 and prevents the atoms sputtered from the targets T from adhering to the target electrode holder 61. The upper shield place 63 has openings 63a formed in areas opposing the target attachment surfaces (attachment surfaces) of the target electrodes. Four target electrodes 35 to 38 are held by the target electrode holder 61, and thus the openings are formed at positions in the upper shield plate 63 that oppose the target attachment surfaces of the target electrodes 35 so 38. On both sides or each of the four openings 63a formed in the upper shield plate 63 are provided stationary separating walls 71 (second separating walls) that are plate-like members protruding toward the first shutter plate 65. The stationery separating walls 71 will be described later.

The first shutter plate (first shutter member) 65 is a shutter plate that is rotatably provided on the substrate holder 33 side of the upper shield plate 63, and is capable of controlling the rotation angle by rotating a rotation shaft 65b. The first shutter plate 65 has openings 65a formed in areas that can oppose the target attachment surfaces of two target electrodes by rotation. The two openings 55a of the first shutter plate 65 are formed in positions symmetric about the rotation shaft 65b. On both sides of each of the two openings 65a of the first shutter plate 65 are provided rotational separating walls 72 (first separating walls) that are plate-like members protruding toward the upper shield plate 63. The rotational separating walls 72 will be described later.

The second shutter plate (second shutter member) 67 is a shutter plate that is rotatably provided on the substrate holder 33 side of the first shutter plate 65, and is capable of controlling the rotation angle by rotating a rotation shaft 67b. The rotation shaft 65b and the rotation shaft 67b are configured so as to be capable of controlling rotation independently of each other. The second shutter plate 67 has openings 67a formed in areas respectively opposing the target attachment surfaces of three target electrodes by rotation. Also, among the three openings of the second shutter plate 67, two openings in positions symmetric about the rotation shaft 67b are formed such that they can be disposed opposing the two openings of the first shutter plate 65.

Figure 5:
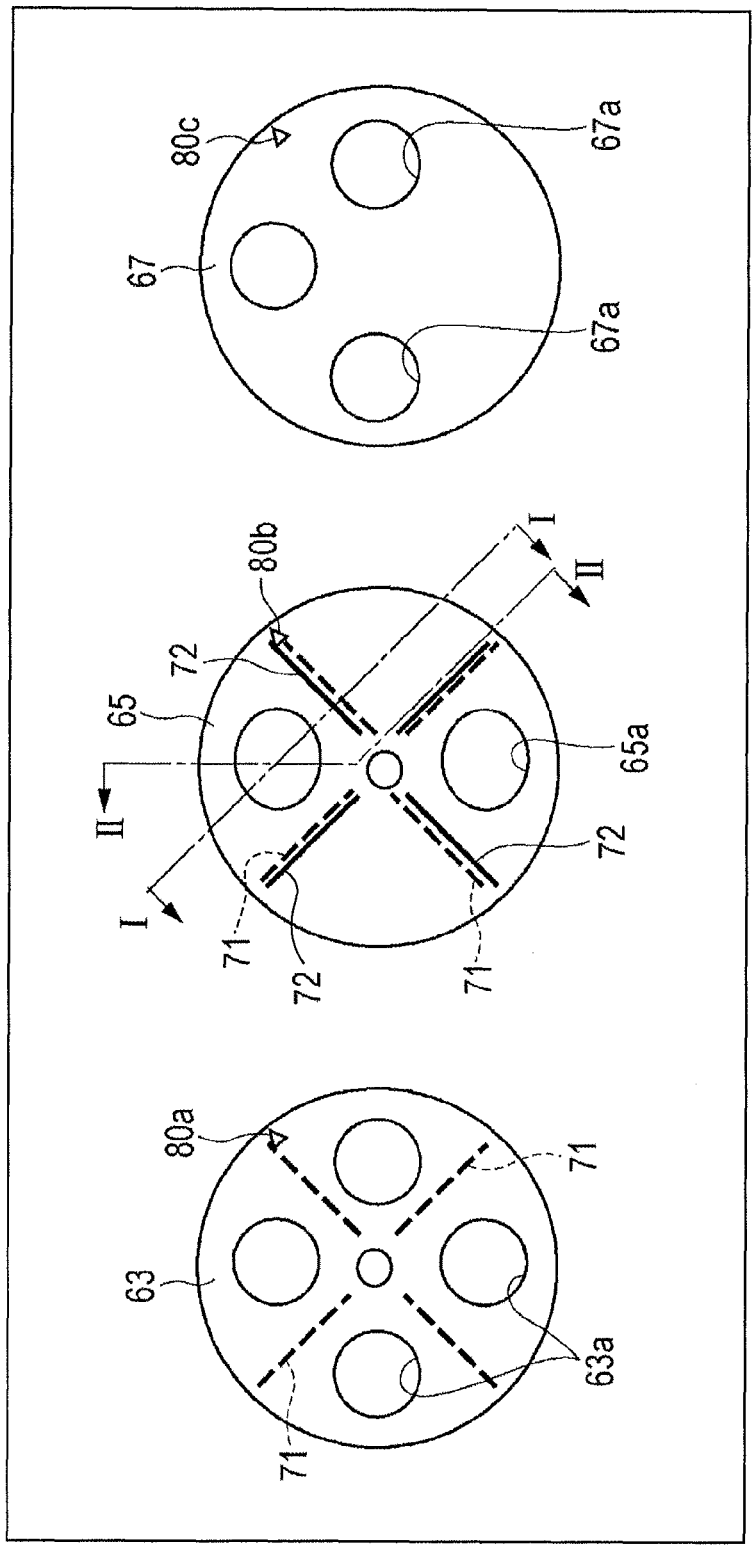
FIG. 5 depicts a schematic view showing members constituting the shutter apparatus according to the first embodiment of the present invention, as viewed from above.

FIG. 5 is a schematic view showing the upper shield plate 63, the first shutter plate 65 and the second shutter plate 67 among the members constituting the shutter apparatus 54, as viewed from above. In FIG. 5, in order to clearly show the positional relationship between the stationery separating walls 71 and the rotational separating walls 72 as viewed from above, the stationery separating walls 71, which actually cannot be seen from above, are indicated by broken lines. As described above, four stationery separating walls 71 are provided on the first shutter plate 65-side sue face of the upper shield place 63, and four rotational separating walls 72 are provided on the upper shield plate 63-side surface of the first shutter plate 65.

The stationery separating walls 71 (second Separating walls) are four plate-like members (protruding members) protruding toward the first shutter plate 65, each attached to a position between adjacent openings 63a. The four stationery separating walls 71 are disposed so as to radially extend from the center of the upper shield plate 63. In the present embodiment, the stationery separating walls 71 are attached to the upper shield plate 63, but in the case of a configuration without the upper shield plate 63, the stationery separating walls 71 may be attached to the container 51 or the target electrode holder 61.

The rotational separating walls 72 (first separating walls) are four plate-like members (protruding members) protruding toward the upper shield plate 63, each attached on both sides in the circumferential direction of each opening 65a. The four rotational separating walls 72 are disposed so as to radially extend from the center of the first shutter plate 65. In FIG. 5, reference numerals 80a, 80b and 80c are marks indicating the reference position of the rotation angle of the first shutter plate 65 and the second shutter plate 67.

Figure 6A:
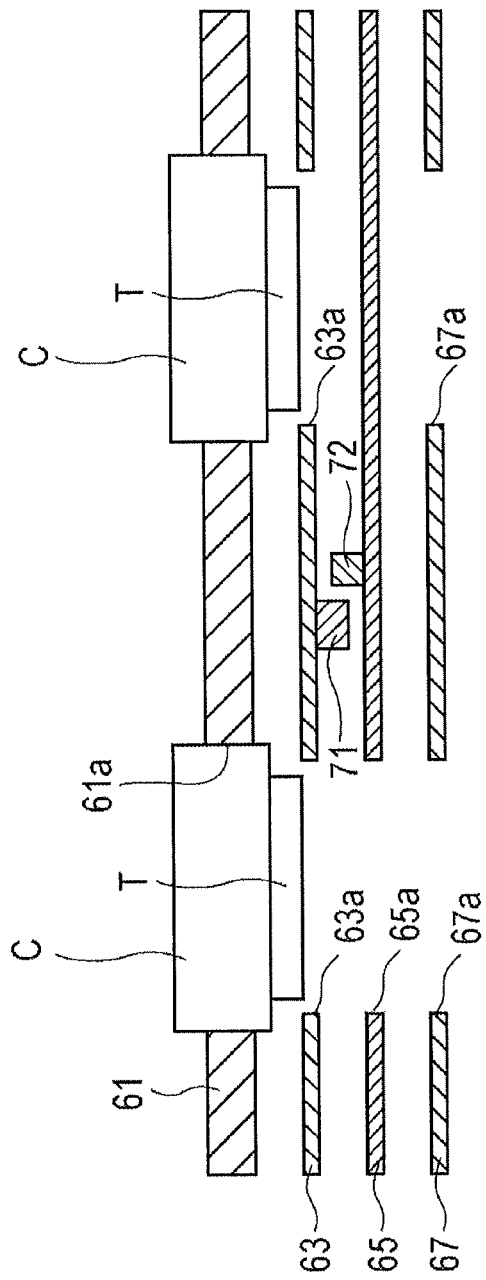
FIG. 6A depicts a cross-sectional view taken along the line I-I of FIG. 5.
Figure 6B:
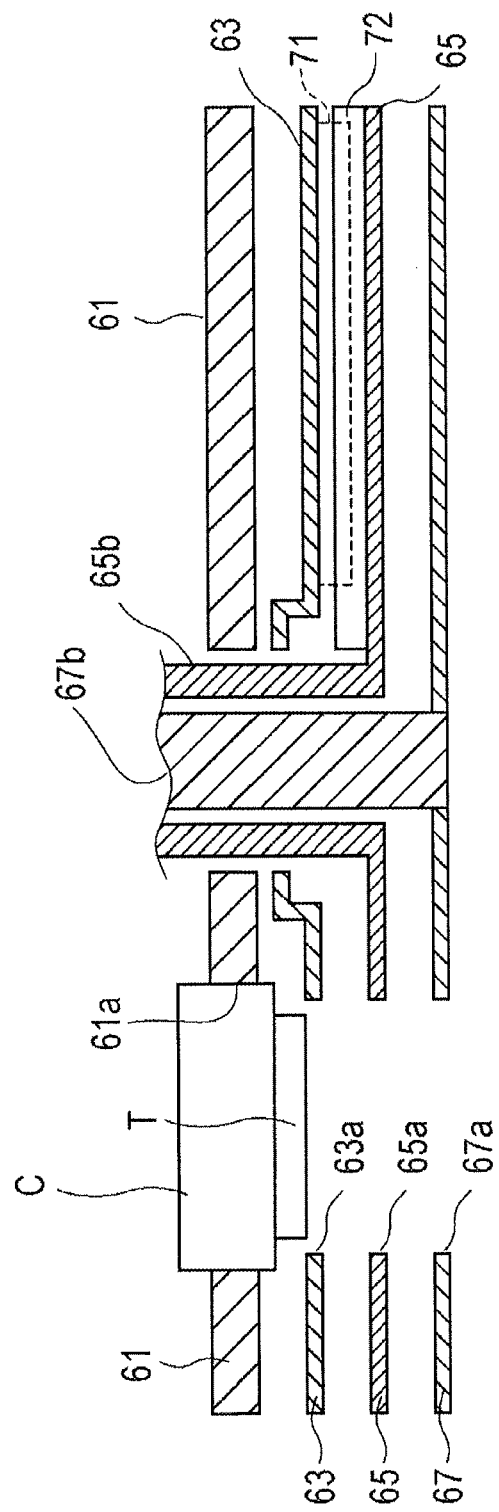
FIG. 6B depicts a cross-sectional view taken along the line II-II of FIG. 5.

FIG. 6A is a cross-sectional view taken along the line I-I of FIG. 5, and FIG. 6B is a cross-sectional view taken along the line II-II of FIG. 5. In FIG. 6B, a stationery separating wall 71 and a rotational separating wall 72 are illustrated in order to clearly show the positional relationship between the stationery separating wall 71 and the rotational separating wall 72 as viewed from the side. In FIGS. 6A and 6B, a given target electrode selected from among the target electrodes 35 to 38 is indicated by reference character C, and a given target is indicated by reference character T. For the sake of simplifying the drawing, the target electrode holder 61, the upper shield plate 63, the first shutter plate 65 and the second shutter plate 67 are illustrated assuming that they are all configured to be parallel to each other.

FIG. 6A shows an arrangement of the first shutter plate 65 and the second shutter plate 67 in the case where only one of the targets T that is located on the left side in the pauper plane is used in sputter film formation. Specifically, at a position opposing one of the targets T is an opening 65a of the first shutter plate 65, and a position opposing the other target T is closed, by the first shutter plate 65. The positions of the second shutter plate 67 that respectively oppose the targets T are open by openings 67a.

Between the two opposing targets T are located a stationery separating wall 71 and a rotational separating wall 72. The stationery separating wall 71 and the rotational separating wall 72 have an overlapping area in the axial direction of the rotation shafts 65b and 67b (rotation shaft direction). Specifically, the sum of the height of the stationery separating wall 71 and the height of the rotational separating wall 72 is set to be longer than the length of the gap between the upper shield plate 63 and the first shutter plate 66. When the stationery separating wall 71 and the rotational separating wall 72 are viewed from the circumferential direction in FIG. 6B, the stationery separating wall 71 is formed so as to extend radially from the rotation shaft 65b to an outer perimeter portion of the upper shield plate 63. The rotational separating wall 72 is also formed so as to extend radially from the rotation shaft 65b to an outer perimeter portion of the first shutter plate 65.

In other words, in a gap area between the upper shield plate 63 and the first shutter plate 65, an indirect path (labyrinth path) can be formed by the stationery separating wall 71 and the rotational separating wall 72. This configuration can effectively prevent the atoms sputtered from one of the targets T from passing through the gap between the upper shield plate 63 and the first shutter plate 65 and reaching the other target T.

In the present embodiment, the stationery separating wall 71 and the rotational separating wall 72 have an overlapping area in the axial direction or the rotation shafts 65b and 67b, and thus if the first shutter plate 65 is rotated by a predetermined angle or more about the rotation shaft 65b, the rotational separating wall 72 comes into contact with the stationery separating wall 71. That is, as shown in FIG. 5, all of the rotational separating walls 72 are provided such that they can be positioned close to one side in the circumferential direction of the stationery separating walls 71. During sputter film formation processing, the rotational separating walls 72 are disposed on one side in the circumferential direction of the stationary separating walls 71 so as to have a predetermined gap with the stationery separating walls 71, thereby forming indirect paths (labyrinth paths) between the rotational separating walls 72 and the stationary separating walls 71. The predetermined gap can be, for example, several millimeters wide.

For example, the first shutter plate 65 can be rotated counterclockwise to almost 90° with respect to the paper plane of FIG. 5, with the positional relationship between the stationery separating walls 71 and the rotational separating walls 72 shown in FIG. 5 as a reference. The first shutter plate 65 can be rotated to a position immediately before each rotational separating wall 72 contacts the other side of the next stationery separating wall 71 in the circumferential direction, and the angle to which the first shutter plate 67 can be rotated is, for example, 70 to 90° although the angle can vary slightly according to the thickness in the circumferential direction of the stationery separating walls 71 and the rotational separating walls 72.

In the present embodiment, the angle to which the first shutter plate 65 can be rotated (rotation angle) is set to 80°. Because the rotation angle is less than 90°, the openings 65a of the first shutter plate 65 can be formed to have a longer length in the circumferential direction than in the radial direction of the first shutter plate 65, so that the areas opposing the targets can be wide open. There is no limitation on the angle to which the second shutter plate 67 can be rotated.

The operations of the shutter apparatus 54 according to the present embodiment and advantageous effects thereof will be described with reference to FIG. 7. FIG. 7 schematically shows the target electrode holder 61, the first shutter plate 65 and the second shutter plate 67 as viewed from above in a table so us to show the rotational positions of the first shutter plate 65 and the second shutter plate 67 when a target or targets are used. The rightmost column of FIG. 7 schematically shows the shutter apparatus 54 as viewed from the substrate 34 side. In FIG. 7, the upper shield plate 63 is unitary with the target electrode holder 61, and the targets attached to the target electrodes 35 to 36 are respectively indicated by reference characters T1 to T4.

First, a description will be given of an operation of the shutter apparatus 54 when a film is formed on the substrate 34 by using only a target T1 from among the combinations showing the rotational positions of the first shutter plate 65 and the second shutter plate 67 in FIG. 7. The description will be given with reference to the row in which T1 is written in FIG. 7. Sputter film formation using the target T1 is performed by aligning an opening 65a of the first shutter plate 65 and an opening 67a of the second shutter plate 67 with respect to the target T1 and depositing a predetermined film on the surface of the rotating substrate 34. At this time, targets T2 and T4 are covered with the first shutter plate 65, and a target T3 is covered with the second shutter plate 67. This configuration can prevent the film-forming substance sputtered from the target T1 from adhering to the other targets T2, T3 and T4 from the substrate side.

Furthermore, at each position between the target T1 and the target T2 and between the target T1 and the target T3, the stationery separating wall 71 and the rotational separating wall 72 form an indirect path (labyrinth path), thereby preventing the film-forming substance from the target T1 from moving in the gap between the upper shield plate 63 and the first shutter plate 65, as a result of which contamination can be prevented effectively. Also, the front surfaces of the targets T2 and T4 are covered with the first shutter plate 65, and thus it is possible to prevent the film-forming substance from moving from the target T1 to the targets T2 and T4 through the gap between the first shutter plate 65 and the second shutter plate 67. The target T3 is not covered with the first shutter plate 65, but because of the fact that the target T3 is located farthest away from the target T1 and that the rotation shafts 65b and 67b are present between the targets T3 and T1, the film-forming substance from the target T1 can be prevented from reaching the target T3.

Next, an operation of the shutter apparatus 54 when a film is formed on the substrate 34 by using only the target T2 will be described (with reference to the row in which T2 is written in FIG. 7). In the case where sputter film formation is performed by using only the target T2, as compared with the case where only the target T1 is used, both the first shutter plate 65 and the second shutter plate 67 are rotated counterclockwise 80° with respect to the paper plane. Through this, an opening 65a of the first shutter plate 65 and an opening 67a of the second shutter plate 67 can be aligned with respect to the target T2. The targets T1 and T3 are covered, with the first shutter plate 65, and the target T4 is covered with the second shutter plate 67. This configuration can prevent the film-forming substance sputtered from the target T2 from adhering to the other targets T1, T3 and T4 from the substrate side.

At each position between the target T2 and the target T3 and between the target T2 and target T4, the stationery separating wall 71 and the rotational separating wall 72 form an indirect path (labyrinth path), thereby preventing the film-forming substance from the target T2 from moving in the gap between the upper shield plate 63 and the first shutter plate 65, as a result of which contamination can be prevented effectively. Also, the front surfaces of the targets T1 and T3 are covered with the first shutter plate 65, and thus it is possible to prevent the film-forming substance from moving from the target T2 to the targets T1 and T3 through the gap between the first shutter plate 65 and the second shutter plate 67. Also, because the target T4 is located farthest away from the target T2, and the rotation shafts 65b and 67b are present between the targets T4 and T2, the film-forming substance from the target T2 can be prevented from reaching the target T4.

An operation of the shutter apparatus 54 when a film is formed on the substrate 34 by using only the target T3 will be described (with reference to the row in which T3 is written in FIG. 7). In the case where sputter film formation is performed by using only the target T3, as compared with the case where only the target T1 is used, the first shutter plate 65 is not rotated and the second shutter plate 67 is rotated 180° with respect to the paper plane. The targets T2 and T4 are covered with the first shutter plate 65, and the target T1 is covered, with the second shutter plate 67. This configuration can prevent the film-forming substance sputtered from the target T3 from adhering to the other targets T1, T2 and T4 from the substrate side.

At each position between the target T3 and the targets T2 and T4 that are respectively adjacent to opposite sides of the target T3 in the circumferential direction, the stationery separating wall 71 and the rotational separating wall 72 form an indirect path (labyrinth path), thereby preventing the film-forming substance from the target T3 from moving in the gap between the upper shield plate 63 and the first shutter plate 65, as a result of which contamination can be prevented effectively. Also, the front surfaces of the targets T2 and T4 are covered with the first shutter plate 65, and thus it is possible to prevent the film-forming substance from moving from the target T3 to the targets T2 and T4 through the gap between the first shutter plate 65 and the second shutter plate 67. Also, because the target T1 is located farthest away from the target T3, and the rotation shafts 65b and 67b are present between the targets T1 and T3, the film-forming substance from the target T3 can be prevented from reaching the target T1.

An operation of the shutter apparatus 54 when a film is formed on the substrate 34 by using only the target T4 will be described (with reference to the row in which T4 is written in FIG. 7). In the case where sputter film formation is performed by using only the target T4, as compared with the case where only the target T1 is used, the first shutter plate 65 is rotated counterclockwise 80° with respect to the paper plane, and the second shutter plate 67 is rotated counterclockwise 270° with respect to the paper plane. The targets T1 and T3 are covered with the first shutter plate 65, and the target T2 is covered with the second shutter plate 67. This configuration can prevent the film-forming substance sputtered from the target T4 from adhering to the other targets T1, T2 and T3 from the substrate side.

At each position between the target T4 and the targets T1 and T3 that are respectively adjacent to opposite sides of the target T4 in the circumferential direction, the stationery separating wall 71 and the rotational separating wall 72 form an indirect path (labyrinth path), thereby preventing the film-forming substance from the target T4 from moving in the gap between the upper shield plate 63 and the first shutter plate 65, as a result of which contamination can be prevented effectively. Also, the front surfaces of the targets T1 and T3 are covered with the first shutter plate 65, and thus it is possible to prevent the film-forming substance from the target T4 from adhering to the targets T1 and T3 through the gap between the first shutter plate 65 and the second shutter plate 67. Also, because the target T2 is located farthest away from the target T4, and the rotation shafts 65b and 67b are present between the target T2 and T4, the film-forming substance from the target T4 can be prevented from reaching the target T2.

An operation of the shutter apparatus 54 when a film is formed on the substrate 34 by simultaneous sputtering (co-sputtering) or simultaneous film formation processing using both the targets T1 and T3 will be described (with reference to the row in which T1-T3 Co-SP is written in FIG. 7). In the case where co-sputtering using the targets T1 and T3 is performed, as compared with the case where only the target T1 is used, the first shutter plate 65 is not rotated and the second shutter plate 67 is rotated counterclockwise 90° with respect to the paper plane. At this time, the targets T1 and T3 are open with respect to the substrate 34, and the targets T2 and T4 are covered with the first shatter plate 65.

At each position on both sides in the circumferential direction of each of the targets T1 and T3, the stationery separating wall 71 and the rotational separating wall 72 form an indirect path (labyrinth path), thereby preventing the film-forming substance from the targets T1 and T3 from moving in the gap between the upper shield plate 63 and the first shutter plate 65, as a result of which contamination can be prevented effectively. Also, the front surfaces of the targets T2 and T4 are covered with the first shutter plate 62, and thus it is possible to prevent the film-forming substance from moving from the targets T1 and T3 to the targets T2 and T4 through the gap between the first shutter plate 65 and the second shutter plate 67. In the co-spattering using the targets T1 and T3, the two openings 65a of the first shutter plate 65 are symmetrically positioned with the rotation shaft 65b interposed therebetween, and thus the distance between the targets T1 and T3 is long, as a result of which cross contamination can be prevented effectively. Particularly when the film-forming substances of the targets T1 and T3 are different, cross contamination can be prevented effectively by the configuration of the present embodiment.

An operation of the shutter apparatus 54 when a film is formed on the substrate 34 by co-sputtering using both the targets T2 and T4 will be described (with reference to the row in which T2-T4 Co-SP is written in FIG. 7). In the case where co-sputtering using the targets T2 and T4 is performed, as compared with the case where only the target T1 is used, the first shutter plate 65 is rotated counterclockwise 80° with respect to the paper plane, and the second shutter plate 67 is not rotated. At this time, the targets T2 and T4 are open with respect to the substrate 34, and the targets T1 and T3 are covered with the first shutter plate 65.

At each position on both sides in the circumferential direction of each of the targets T2 and T4, the stationery separating wall 71 and the rotational separating wall 72 form an indirect path (labyrinth path), thereby preventing the film-forming substance from the targets T2 and T4 from moving in the gap between the upper shield plate 63 and the first shutter plate 65, as a result of which contamination can be prevented effectively. Also, the targets T1 and T3 are covered with the first shutter plate 65, and thus it is possible to prevent the film-forming substance from moving from the targets T2 and T4 to the targets T1 and T3 through the gap between the first shutter plate 65 and the second shutter plate 67. In the co-sputtering using the targets T2 and T4, the two openings 65a of the first shutter plate 65 are symmetrically positioned with the rotation shaft 65b interposed therebetween, and thus the distance between the targets T2 and T4 is long, as a result of which cross contamination can be prevented effectively. Particularly when the film-forming substances of the targets T2 and T4 are different, cross contamination can be prevented effectively by the configuration of the present embodiment.

The above embodiment described a film-forming apparatus that can mount four targets (target electrodes) thereon, but the number of targets is not limited to four. For example, a configuration in which two targets (target electrodes) are mounted, the first shutter plate 65 has two openings 65a, and the second shutter plate 67 has two openings 67a can also produce the same effect of preventing contamination as the above embodiment. In this case, a film-forming apparatus including only the targets T1 and T3 (or the targets T2 and T4) as shown in FIG. 7 is preferably used.

The advantageous effects of the film-forming apparatus of the present embodiment will be described. By providing a rotary shutter 54 as described above in a film-forming apparatus that includes a plurality of targets in a single chamber, forms a multi-layered film by sputtering, and selects a target by using the rotary shutter apparatus, contamination between targets can be presented effectively. In particular, cross contamination during simultaneous sputter film formation can be prevented effectively. This enables a high-performance multi-layered film to be deposited on a substrate.

Also, in the shutter apparatus 54 of the film-forming apparatus 10, the first shutter plate 65 and the second shutter place 67 are formed to have a cross-sectional shape that is curved so as to be parallel to the sputter surfaces of the targets (the target attachment surfaces of the target electrodes). By using such shutter plates 65 and 67, in the film-forming apparatus of the present embodiment that obliquely sputters a film-forming substance with respect to the substrate 34, a uniform film thickness distribution can also be achieved without reducing the film-forming speed.

Second Embodiment

Another embodiment of the present invention will be described below. Each of the shutter apparatuses 54 described in the above embodiment includes the first shutter plate 65 and the second shutter plate 67, but with a shutter apparatus that does not include the second shutter plate 67, the occurrence of contamination can also be prevented. Specifically, this is because at each position on both sides in the circumferential direction of each of the targets T1 to T4, the stationery separating wall 71 and the rotational separating wall 72 forms an indirect path (labyrinth path), thereby preventing the film-forming substance from moving in the gap between the upper shield plate 63 and the first shutter plate 65. Furthermore, a target that is not used is covered with the first shatter plate 65, and thus it is possible to prevent a sputtered substance from adhering to a target that is not used. In the present embodiment, contamination can be prevented in a film-forming apparatus that can mount two or more targets thereon.

Third Embodiment

In each of the shutter apparatuses 54 described in the above embodiment, the upper shield plate 63 is disposed between the first shutter plate 65 and the target electrodes C, but with a configuration in which the upper shield plate 63 is disposed between the first shutter plate 65 and the second shutter plate 67, substantially the same advantageous effects can also be obtained. In this case, the rotational separating walls 72 are provided on the substrate holder 33-side surface of the first shutter plate 65, and the stationery separating walls 71 are provided, on the first shutter member 65-side surface of the upper shield plate 63. Likewise, with a configuration in which the upper shield plate 63 is disposed on the substrate holder 33 side of the second shutter plate 67, and the rotational separating walls 72 are provided on the substrate holder 33-side surface of the second shutter plate 67, substantially the same advantageous effects can also be obtained.

Fourth Embodiment

Furthermore, a shutter apparatus having a configuration excluding the stationery separating walls 71 and the rotational separating walls 72 from the shutter apparatus 54 will be described. With the shutter apparatus that does not include the stationery separating walls 71 and the rotational separating walls 72, it is also possible to prevent a film-forming substance from moving to the other targets through the gap between the first shutter plate 65 and the second shutter plate 67. This is because the two openings 65a of the first shutter plate 65 are positioned apart from each other, and the rotation shafts 65b and 67b are present between two targets. Particularly in film formation processing by co-sputtering, cross contamination caused by a film-forming substance that has passed through the gap between the first shutter plate 65 and the second shutter plate 67 can be prevented.

The present invention is not limited to the above-described embodiments, and various changes and modifications can be made within the spirit and scope of the present invention. Therefore, to apprise the public of the scope of the present invention, the following claims are made.

DESCRIPTION OF THE REFERENCE NUMERALS

T Target
10 Film-Forming Apparatus
11 Robotic Conveyance Apparatus
12 Conveyance Chamber
14 Hand
15, 16 Load/Unload Chamber
17A to 17E Film-Forming Chamber
20 Gate valve
33 Substrate Holder
34 Substrate
35 to 38, C Target Electrode
51 Container
52 Ceiling Portion
53 Magnet
54 Shatter Apparatus
61 Target Electrode Holder
63 Upper Shield Plate (Shield Member)
65 First Shutter Plate (First Shutter Member)
63a, 65a, 67a Opening
65b, 67b Rotation Shaft
67 Second Shatter Plate (Second shutter Member)
71 Stationery Separating Wall (Second Separating Wall)
72 Rotational Separating Wall (First Separating Wall)

What is claimed is:

1. A film-forming apparatus comprising:
a plurality of target electrodes each having an attachment surface to which a target can be attached;
a substrate holder for holding a substrate;
a first shutter member rotatably provided between the plurality of target electrodes and the substrate holder and having a plurality of openings;

a shield member provided between the target electrodes and the first shutter member, the shield member having openings opposing the attachment surfaces;

first separating walls provided on a surface of the first shutter member, which faces the shield member, so as to face the shield member; and second separating walls provided on a surface of the shield member, which faces the first shutter member, wherein the first separating walls are provided so as to sandwich each of the plurality of openings of the first shutter member, and wherein the first shutter member is rotated about a rotation axis to change the target to be used for film forming while a distance between the first shutter member and the shield member is kept constant, such that the first separating walls are positioned close to respective ones of the second separating walls and gaps in a circumferential direction of the rotation are formed between the first separating walls and the respective ones of the second separating walls, the gaps being effective to prevent atoms from the targets passing through the gaps.

2. The film-forming apparatus according to claim 1, further comprising a second shutter member rotatably provided between the first shutter member and the substrate holder and having an opening that opposes any one of the plurality of openings of the first shutter member when the first shutter member or the second shutter member is rotated, wherein the number of openings in the second shutter member is greater than or equal to the number of the plurality of openings in the first shutter member.

3. The film-forming apparatus according to claim 1, wherein the number of the openings of the shielding member is equal to the number of the plurality of target electrodes.

4. The film-forming apparatus according to claim 1, wherein two out of the target electrodes are used in simultaneous film formation processing, and during the simultaneous film formation processing, two openings out of the plurality of openings of the first shutter member simultaneously oppose the attachment surfaces of the target electrodes used in the simultaneous film formation processing.

5. The film-forming apparatus according to claim 4, wherein two openings are formed in the first shutter member as all or some of the plurality of openings, and the two openings are formed in symmetric positions about the rotation axis.

6. The film-forming apparatus according to claim 1, wherein both the first separating wall and the second separating wall extend radially about the rotation axis.

7. The film-forming apparatus according to claim 1, wherein the plurality of openings formed in the first shutter member have a dimension that is longer in the circumferential direction than in a radial direction with respect to the rotation axis.

8. The film-forming apparatus according to claim 1, wherein a sum of a height of the first separating wall and a height of the second separating wall is larger than the distance between the first shutter member and the shield member.

9. The film-forming apparatus according to claim 1, wherein the plurality of target electrodes are arranged on a circle whose center is arranged on the rotation axis.

* * * * *